United States Patent
Jiang

(10) Patent No.: US 11,933,351 B2
(45) Date of Patent: Mar. 19, 2024

(54) HINGE, FLEXIBLE DISPLAY PANEL, AND ELECTRONIC DEVICE

(71) Applicants: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

(72) Inventor: Guobao Jiang, Hubei (CN)

(73) Assignees: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/618,465

(22) PCT Filed: Nov. 23, 2021

(86) PCT No.: PCT/CN2021/132302
§ 371 (c)(1),
(2) Date: Dec. 11, 2021

(87) PCT Pub. No.: WO2023/070784
PCT Pub. Date: May 4, 2023

(65) Prior Publication Data
US 2024/0011522 A1    Jan. 11, 2024

(30) Foreign Application Priority Data
Oct. 26, 2021   (CN) .......................... 202111245964.9

(51) Int. Cl.
*H05K 5/02* (2006.01)
*F16C 11/04* (2006.01)

(52) U.S. Cl.
CPC ............ *F16C 11/04* (2013.01); *H05K 5/0226* (2013.01)

(58) Field of Classification Search
CPC ...... F16C 11/04; H05K 5/0226; G06F 1/1681
See application file for complete search history.

(56) References Cited

U.S. PATENT DOCUMENTS 10,890,951 B1 *  1/2021  Watamura ........... E05D 11/0054
2021/0034116 A1 *  2/2021  Torres ................... G06F 1/1616
(Continued)

FOREIGN PATENT DOCUMENTS

| | | |
|---|---|---|
| CN | 111692196 A | 9/2020 |
| CN | 111986568 A | 11/2020 |

(Continued)

OTHER PUBLICATIONS

International Search Report in International application No. PCT/CN2021/132302,dated Aug. 1, 2022.
(Continued)

*Primary Examiner* — James Wu
*Assistant Examiner* — Christopher L Augustin
(74) *Attorney, Agent, or Firm* — PV IP PC; Wei Te Chung; Zhigang Ma

(57) ABSTRACT

The present application provides a hinge, a flexible display panel, and an electronic device, the electronic device includes a flexible display panel, the flexible display panel comprises a flexible display panel body and a hinge, the hinge comprises a first transmission member, a second transmission member, a third transmission member, and a fourth transmission member to form a four-link structure, such that a first rotating mechanism and a second rotating
(Continued)

mechanism may achieve an effect of bilateral synchronous rotation.

20 Claims, 8 Drawing Sheets

(56) References Cited

U.S. PATENT DOCUMENTS

| | | |
|---|---|---|
| 2021/0165466 A1 | 6/2021 | Kang et al. |
| 2023/0007797 A1* | 1/2023 | Jiang .................... H05K 5/0226 |

FOREIGN PATENT DOCUMENTS

| | | |
|---|---|---|
| CN | 213655445 U | 7/2021 |
| CN | 113202857 A | 8/2021 |

OTHER PUBLICATIONS

Written Opinion of the International Search Authority in International application No. PCT/CN2021/132302, dated Aug. 1, 2022.

* cited by examiner

HINGE, FLEXIBLE DISPLAY PANEL, AND ELECTRONIC DEVICE

FIELD OF INVENTION

The present disclosure relates to a display technology field, specifically to a hinge, a flexible display panel, and an electronic device.

BACKGROUND OF INVENTION

With continuous development of display technology, various displays with different characteristics have emerged to meet different use requirements. A development trend of intelligence, portability, and flexibility is one of main development directions of current electronic devices. A most outstanding advantage of flexible display technology over conventional flat panel display technology is that it breaks through an inherent concept of original two-dimensional display and expands application fields of the display technology to more portable electronic devices. Users may fold or curl an electronic device having a flexible display panel as needed, so as to reduce size of the electronic device and improve portability of the electronic device.

SUMMARY OF INVENTION

Technical Problem

Current foldable electronic devices achieve effects of unfolding and folding by two rotating mechanisms disposed oppositely in a hinge. During a folding or unfolding process of the electronic device, since rotational speeds of the two rotating mechanisms in the hinge may not always be kept same, the electronic device may not realize bilateral synchronous rotation, and a main body of a flexible display panel of the electronic device is pressed or pulled by the hinge, thereby reducing service life of the electronic device.

The flexible display panel used is relatively compact, has poor performance on bending resistance and impact resistance, and lacks support for a flexible portion of the flexible display panel. Irreversible creases are easily generated during repeated folding and unfolding processes, which not only affects flatness of the flexible display panel, but also results in significant deterioration in a display effect of the flexible display panel.

In summary, there is a problem that a hinge in an existing foldable electronic device may not be used to achieve the bilateral synchronous rotation. Therefore, it is necessary to provide a hinge, a flexible display panel, and an electronic device to improve this defect.

Technical Solution

Embodiments of the present application provide a hinge, a flexible display panel, and an electronic device for solving a problem that a hinge in a conventional foldable electronic device may not be used to achieve bilateral synchronous rotation.

An embodiment of the present application provides a hinge comprising:

a fixing bracket;

a first rotating mechanism comprising a first transmission member movably connected to the fixing bracket along a first axis;

a second rotating mechanism comprising a second transmission member movably connected to the fixing bracket along the first axis;

a third transmission member rotatably connected to the fixing bracket along a second axis, and rotatably connected to the first transmission member along a third axis; and a fourth transmission member rotatably connected to the fixing bracket along the second axis, and rotatably connected to the second transmission member along a fourth axis.

According to an embodiment of the present disclosure, the hinge further comprises a first rotating member, the first transmission member comprises a first connecting link, and the second transmission member comprises a second connecting link; and wherein the first rotating member is movably connected to the fixing bracket along the first axis, and one end of the first connecting link and one end of the second connecting link are both rotatably connected to the first rotating member along the first axis.

According to an embodiment of the present disclosure, the one end of the first connecting link has two first extension plates opposite to and spaced apart from each other and extending from a base portion of the first connecting link; and wherein the first rotating member passes through the two first extension plates, and the one end of the second connecting link is rotatably connected between the two first extension plates.

According to an embodiment of the present disclosure, the fixing bracket has two inner walls disposed oppositely, each of the two inner walls is provided with a first slide groove, and opposite ends of the first rotating member are movably mounted in the first slide grooves.

According to an embodiment of the present disclosure, the hinge further comprises a second rotating member, the third transmission member comprises a third connecting link, and the fourth transmission member comprises a fourth connecting link;

the second rotating member is rotatably connected to the fixing bracket along the second axis, and both one end of the third connecting link and one end of the fourth connecting link are rotatably connected to the second rotating member along the second axis.

According to an embodiment of the present disclosure, the hinge further comprises a third rotating member and a fourth rotating member;

wherein the third rotating member is rotatably connected to the first connecting link along the third axis, and another end of the third connecting link is fixedly connected to the third rotating member; the fourth rotating member is rotatably connected to the second connecting link along the fourth axis, and another end of the fourth connecting link is fixedly connected to the fourth rotating member.

According to an embodiment of the present disclosure, the first rotating mechanism comprises a first holding arm, the second rotating mechanism comprises a second holding arm, the first holding arm is rotatably connected to the fixing bracket along a fifth axis, and the second holding arm is rotatably connected to the fixing bracket along a sixth axis; and wherein another end of the first connecting link is movably connected to the first holding arm and another end of the second connecting link is movably connected to the second holding arm.

According to an embodiment of the present disclosure, the first holding arm is provided with second sliding grooves, and the second holding arm is provided with third sliding grooves; and wherein the another end of the first connecting link is provided with first positioning columns movably mounted in the second sliding grooves, and the another end of the second connecting link is provided with second positioning columns movably mounted in the third sliding grooves.

According to an embodiment of the present disclosure, the first holding arm comprises a first base portion, and a first connection portion and a second connection portion, the first connection portion and the second connection portion extend from one side of the first base portion and are spaced apart, and each of a side of the first connection portion facing the second connection portion and a side of the second connection portion facing the first connection portion is provided with the second sliding groove; and the second holding arm includes a second base portion, and a third connection portion and a fourth connection portion, the third connection portion and the fourth connection portion extend from one side of the second base portion and are spaced apart, and each of a side of the third connection portion facing the fourth connection portion and a side of the fourth connection portion facing the third connection portion is provided with the third sliding groove.

According to an embodiment of the present disclosure, the first holding arm comprises a fifth connection portion extending from the one side of the first base portion and spaced apart from the first connection portion, and the second holding arm includes a sixth connection portion extending from the one side of the second base portion and spaced apart from the third connection portion; and the fixing bracket comprises a main body portion, a seventh connection portion extending from one side of the main body portion, and an eighth connection portion extending from another side of the main body portion, the first rotating mechanism includes a fifth rotating member, and the second rotating mechanism includes a sixth rotating member;

wherein the seventh connection portion extends between the first connection portion and the fifth connection portion, and the fifth rotating member passes through the first connection portion and the seventh connection portion along the fifth axis;

the eighth connection portion extends between the third connection portion and the sixth connection portion, and the sixth rotating member sequentially passes through the third connection portion and the eighth connection portion along the sixth axis.

An embodiment of the present disclosure further provides a flexible display panel comprising:

a flexible display panel body comprising a flexible portion and first and second portions connected to opposite ends of the flexible portion; and a hinge comprising:

a fixing bracket;

a first rotating mechanism comprising a first transmission member movably connected to the fixing bracket along a first axis;

a second rotating mechanism comprising a second transmission member movably connected to the fixing bracket along the first axis;

a third transmission member rotatably connected to the fixing bracket along a second axis, and rotatably connected to the first transmission member along a third axis; and a fourth transmission member rotatably connected to the fixing bracket along the second axis, and rotatably connected to the second transmission member along a fourth axis, wherein the first portion is fixedly connected to the first rotating mechanism, and the second portion is fixedly connected to the second rotating mechanism.

According to an embodiment of the present disclosure, the hinge further comprises a first rotating member, the first transmission member comprises a first connecting link, and the second transmission member comprises a second connecting link; and wherein the first rotating member is movably connected to the fixing bracket along the first axis, and one end of the first connecting link and one end of the second connecting link are both rotatably connected to the first rotating member along the first axis.

According to an embodiment of the present disclosure, the one end of the first connecting link has two first extension plates opposite to and spaced apart from each other and extending from a base portion of the first connecting link; and wherein the first rotating member passes through the two first extension plates, and the one end of the second connecting link is rotatably connected between the two first extension plates.

According to an embodiment of the present disclosure, the fixing bracket has two inner walls disposed oppositely, each of the two inner walls is provided with a first slide groove, and opposite ends of the first rotating member are movably mounted in the first slide grooves.

According to an embodiment of the present disclosure, the hinge further comprises a second rotating member, the third transmission member comprises a third connecting link, and the fourth transmission member comprises a fourth connecting link;

the second rotating member is rotatably connected to the fixing bracket along the second axis, and one end of the third connecting link and one end of the fourth connecting link are both rotatably connected to the second rotating member along the second axis.

According to an embodiment of the present disclosure, the hinge further comprises a third rotating member and a fourth rotating member;

wherein the third rotating member is rotatably connected to the first connecting link along the third axis, and another end of the third connecting link is fixedly connected to the third rotating member; the fourth rotating member is rotatably connected to the second connecting link along the fourth axis, and another end of the fourth connecting link is fixedly connected to the fourth rotating member.

According to an embodiment of the present disclosure, the first rotating mechanism comprises a first holding arm, the second rotating mechanism comprises a second holding arm, the first holding arm is rotatably connected to the fixing bracket along a fifth axis, and the second holding arm is rotatably connected to the fixing bracket along a sixth axis;

wherein another end of the first connecting link is movably connected to the first holding arm and another end of the second connecting link is movably connected to the second holding arm.

According to an embodiment of the present disclosure, the first holding arm is provided with second sliding grooves, and the second holding arm is provided with third sliding grooves; and wherein the another end of the first connecting link is provided with first positioning columns movably mounted in the second sliding grooves, and the another end of the second connecting link is provided with second positioning columns movably mounted in the third sliding grooves.

According to an embodiment of the present disclosure, the first holding arm comprises a first base portion, and a first connection portion and a second connection portion, the first connection portion and the second connection portion extend from one side of the first base portion and are spaced apart, and each of a side of the first connection portion facing the second connection portion and a side of the second connection portion facing the first connection portion is provided with the second sliding groove; and the second holding arm includes a second base portion, and a third connection portion and a fourth connection portion, the third connection portion and the fourth connection portion extend from one side of the second base portion and are spaced apart, and each of a side of the third connection portion facing the fourth connection portion and a side of the fourth connection portion facing the third connection portion is provided with the third sliding groove.

An embodiment of the present disclosure further provides an electronic device comprising a flexible display panel, and the flexible display panel comprises:

a flexible display panel body comprising a flexible portion and first and second portions connected to opposite ends of the flexible portion; and a hinge comprising:

a fixing bracket;

a first rotating mechanism comprising a first transmission member movably connected to the fixing bracket along a first axis;

a second rotating mechanism comprising a second transmission member movably connected to the fixing bracket along the first axis;

a third transmission member rotatably connected to the fixing bracket along a second axis, and rotatably connected to the first transmission member along a third axis; and a fourth transmission member rotatably connected to the fixing bracket along the second axis, and rotatably connected to the second transmission member along a fourth axis, wherein the first portion is fixedly connected to the first rotating mechanism, and the second portion is fixedly connected to the second rotating mechanism.

Advantageous Effects

The advantageous effects of the embodiments of the present disclosure are: embodiments of the present application provide a hinge, a flexible display panel and an electronic device. The electronic device includes a flexible display panel, the flexible display panel includes a flexible display panel body and a hinge, the hinge includes a first rotating mechanism and a second rotating mechanism, the first rotating mechanism includes a first transmission member, the second rotating mechanism includes a second transmission member, the hinge further includes a third transmission member and a fourth transmission member, each of the first transmission member and the second transmission member is movably connected to a fixing bracket along a first axis, so that the first transmission member can drive the second transmission member to move while moving, the third transmission member is rotatably connected to the fixing bracket along a second axis, the third transmission member is rotatably connected to the first transmission member along a third axis, the fourth transmission member is rotatably connected to the fixing bracket along the second axis, and the fourth transmission member is rotatably connected to the second transmission member along a fourth axis, so that the rotational angles of the first transmission member and the second transmission member are always the same, thereby enabling the effect of bilateral synchronous rotation of the first and second rotational mechanisms of the hinge.

DESCRIPTION OF DRAWINGS

In order to more clearly explain the technical solutions in the embodiments of the present disclosure or the prior art, the following will briefly introduce the drawings required in the description of the embodiments or the prior art. Obviously, the drawings in the following description are only some embodiments of the present disclosure. For those ordinary skilled in the art, without paying any creative work, other drawings can be obtained based on these drawings.

DETAILED DESCRIPTION OF EMBODIMENTS

Figure 1:
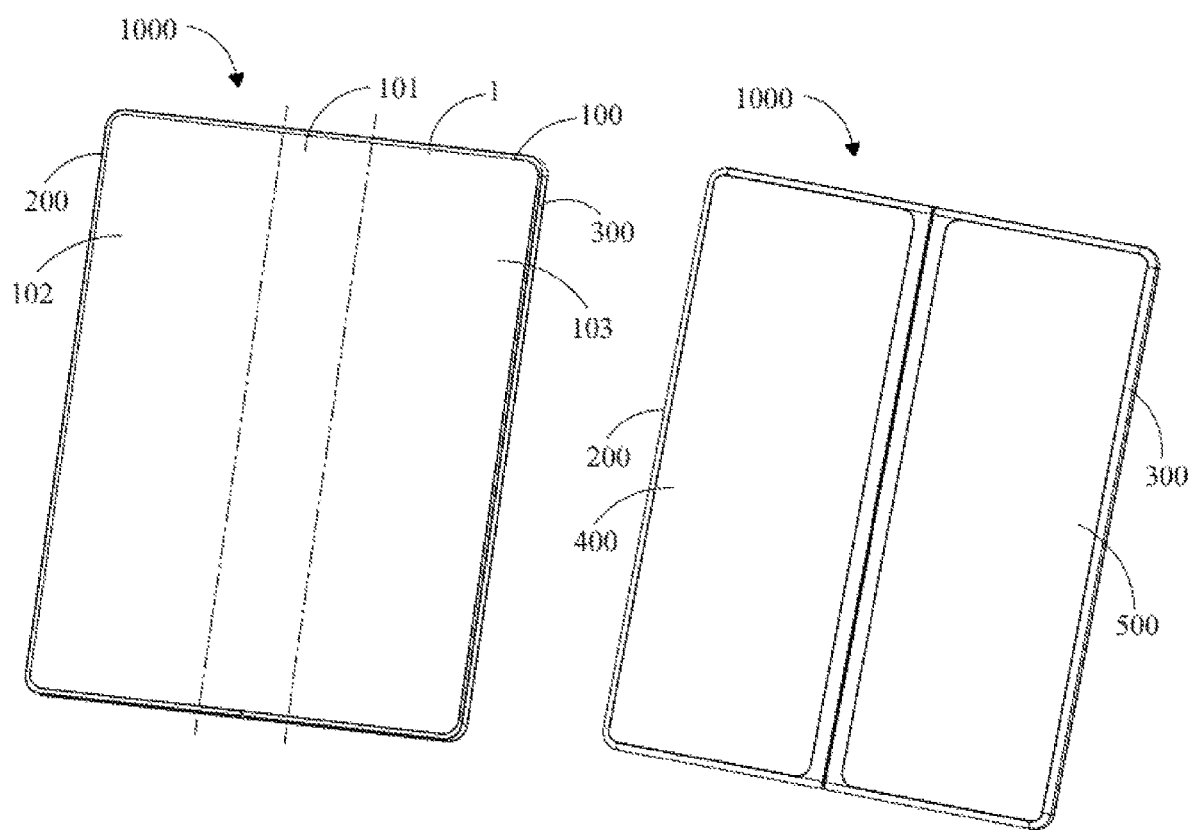
FIG. 1 is a schematic structural diagram of front and back sides of an electronic device in a flat state according to an embodiment of the present disclosure.

The description of the following embodiments refers to the attached drawings to illustrate specific embodiments in which the present disclosure can be implemented. The directional terms mentioned in the present disclosure, such as [up], [down], [front], [back], [left], [right], [inner], [outer], [side], etc., are only the direction of the attached drawings. Therefore, the directional terms used are used to describe and understand the present disclosure, rather than to limit the present disclosure. In the drawings, units with similar structures are indicated by the same reference numerals.

The disclosure will be further described below with reference to the accompanying drawings and specific embodiments:

An embodiment of the present disclosure provides a hinge 2, a flexible display panel 100, and an electronic device 1000. The electronic device 1000 includes the flexible display panel 100, and the flexible display panel 100 includes the hinge 2.

In the embodiment of the present disclosure, the electronic device 1000 may be a mobile terminal, such as a smart phone, a tablet computer, a notebook computer, or the like. The electronic device 1000 may also be a wearable terminal such as a smart watch, a smart bracelet, an intelligent eyewear, an augmented reality device, or the like. The electronic device 1000 may also be a fixed terminal such as a desktop computer, a television, or the like.

Figure 2:
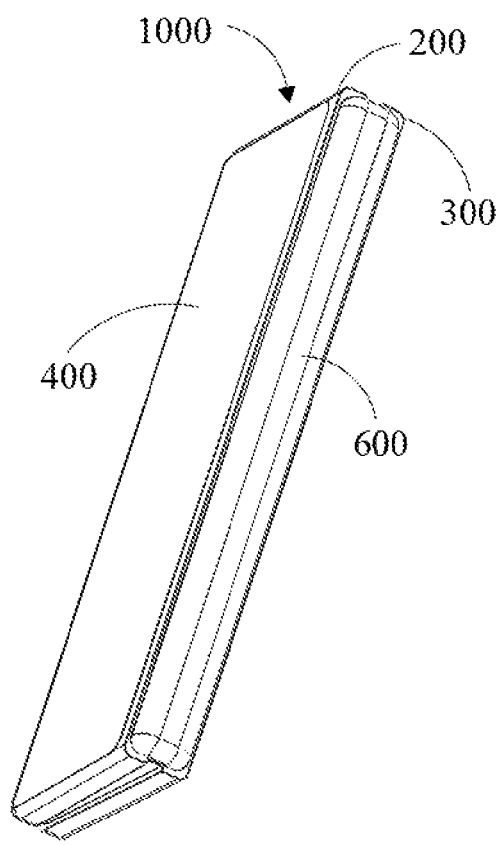
FIG. 2 s a schematic structural diagram of an electronic device in a folded state according to an embodiment of the present disclosure.
Figure 3:
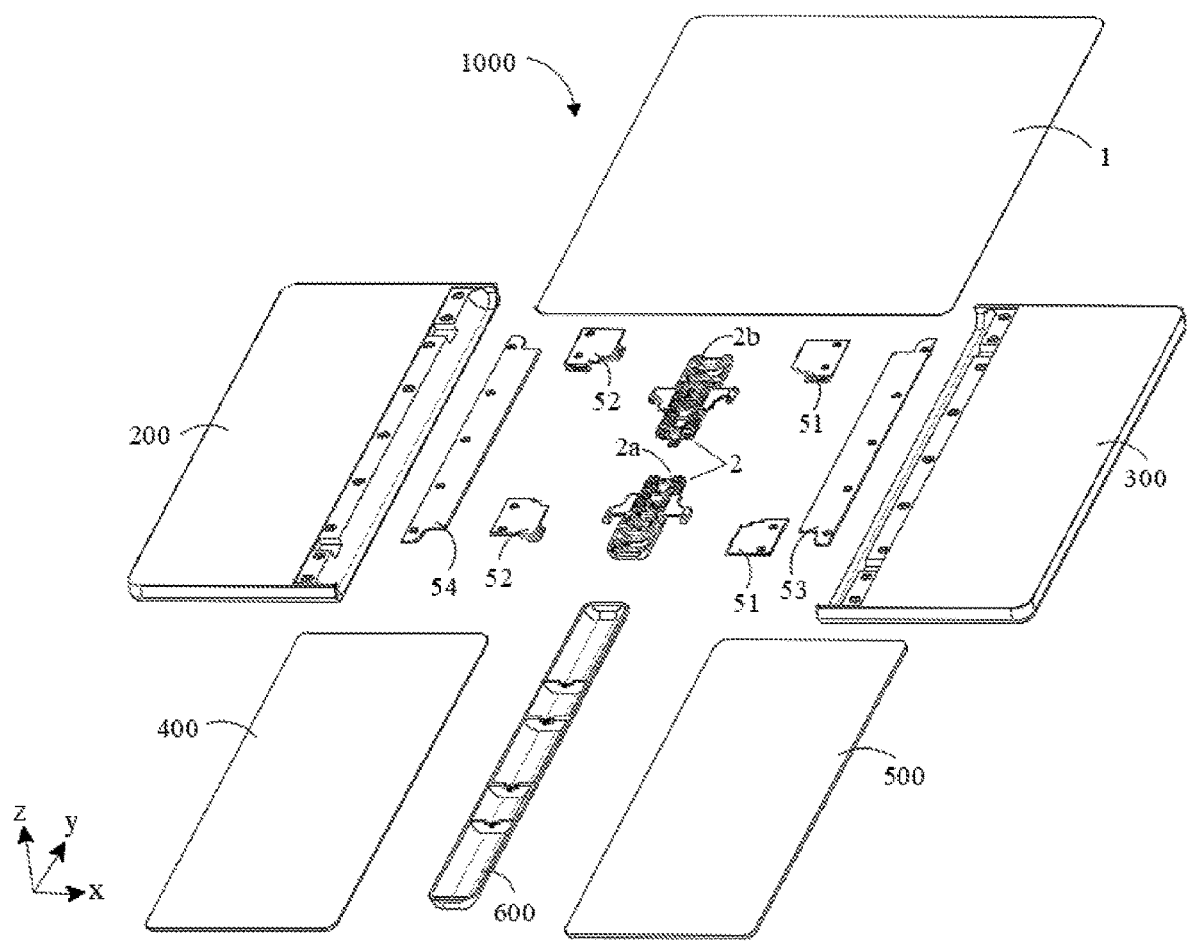
FIG. 3 is a schematic exploded view of an electronic device according to an embodiment of the present disclosure.

As shown in FIGS. 1 to 3, FIG. 1 is a schematic structural diagram of front and back sides of an electronic device in a flat state according to an embodiment of the present disclosure, FIG. 2 is a schematic structural diagram of an electronic device in a folded state according to an embodiment of the present disclosure, and FIG. 3 is a schematic exploded diagram of an electronic device according to an embodiment of the present disclosure. The electronic device 1000 includes the flexible display panel 100, a first housing 200, a second housing 300, a first backplane 400, a second backplane 500, and a third housing 600.

The flexible display panel 100 includes a flexible display panel body 1, the flexible display panel body 1 includes a flexible portion 101, and a first portion 102 and a second portion 103 located at opposite sides of the flexible portion 101, and the flexible portion 101 is a portion of the flexible display panel body 1 that can be folded. The first portion 102 may be disposed on at least a portion of a front side of the first housing 200, and the second portion 103 may be disposed on at least a portion of a front side of the second housing 300.

The first backplane 400 is disposed on a side of the first housing 200 facing away from the flexible display panel 100, and the second backplane 500 is disposed on a side of the second housing 300 facing away from the flexible display panel 100. The first housing 200 and the second housing 300 may have a separate space, electronic components, such as a motherboard, a printed circuit board, a battery, and the like, of the electronic device may be accommodated in the space, these electronic components are required to drive the flexible display panel 100.

It should be noted that the electronic device 1000 may have at least one rotating axis for folding the electronic device 1000, hereinafter, a first direction x indicates a direction perpendicular to the rotating axis, a second direction y indicates a direction parallel to the rotating axis, a third direction z indicates a thickness direction of the electronic device 1000, and a display surface of the electronic device may be defined by the first direction x and the second direction y.

The third housing 600 may be disposed between the first housing 200 and the second housing 300. As the electronic device 1000 is expanded from the folded state shown in FIG. 2 to a flat state shown in FIG. 1, the space between side portions of the first housing 200 and side portions of the second housing 300 may be gradually narrowed, and opposite sides of the third housing 600 may be inserted into the first housing 200 and the second housing 300.

As shown in FIG. 1, when the electronic device 1000 is in the flat state, the third housing 600 may be covered by the first backplane 400 and the second backplane 500, and may not be exposed to the outside.

As the electronic device 1000 is folded from the flat state shown in FIG. 1 to the folded state shown in FIG. 2, the space between the side portion of the first housing 200 and the side portion of the second housing 300 may be gradually widened, and the portion of the third housing 600 covered by the first backplane 400 and the second backplane 500 may be gradually exposed.

As shown in FIG. 2, when the electronic device 1000 is in a fully folded state, at least a portion of the third housing 600 may be exposed to the outside, and the first backplanes 400 and second backplane 500 may still cover some remaining portions of the third housing 600.

The flexible display panel 100 further includes the hinge 2, the third housing 600 may cover an outside of the hinge 2, and may protect the hinge 2. The hinge 2 includes a first hinge 2a and a second hinge 2b, the first hinge 2a and the second hinge 2b are disposed on opposite ends of the third housing 600, respectively. The first hinge 2a and the second hinge 2b may be configured to rotate the first housing 200 and the second housing 300 about two rotational axes parallel to the second direction y and spaced in the first direction x.

In the present embodiment, structures of the first hinge 2a and the second hinge 2b are same, and movement processes are also same. Hereinafter, each of the schematic diagrams will only be described with reference to the structure of the first hinge 2a as an example, and details will not be described here again. In practical application, the structures of the first hinge 2a and the second hinge 2b may be different, provided that the first hinge 2a and the second hinge 2b are capable of synchronously rotating the first housing 200 and the second housing 300.

It should be noted that hereinafter, the flat state may refer to a state in which the electronic device 1000 is fully unfolded, and the front side of the first housing 200 and the front side of the second housing 300 may form a plane such that a state of an angle of about 180 degrees is formed between the front side of the first housing 200 and the front side of the second housing 300. The folded state includes a fully folded state and a transition folded state, the fully folded state may mean that the electronic device 1000 is fully folded, the front side of the first housing 200 and the front side of the second housing 300 may face each other such that a state of an angle of about zero degree is formed between the front side of the first housing 200 and the front side of the second housing 300; the transition folded state may mean that the electronic device 1000 is in any transition state between the flat state and the fully folded state, and an included angle that is substantially greater than zero degree and less than 180 degrees is formed between the front side of the first housing 200 and the front side of the second housing 300.

Figure 4:
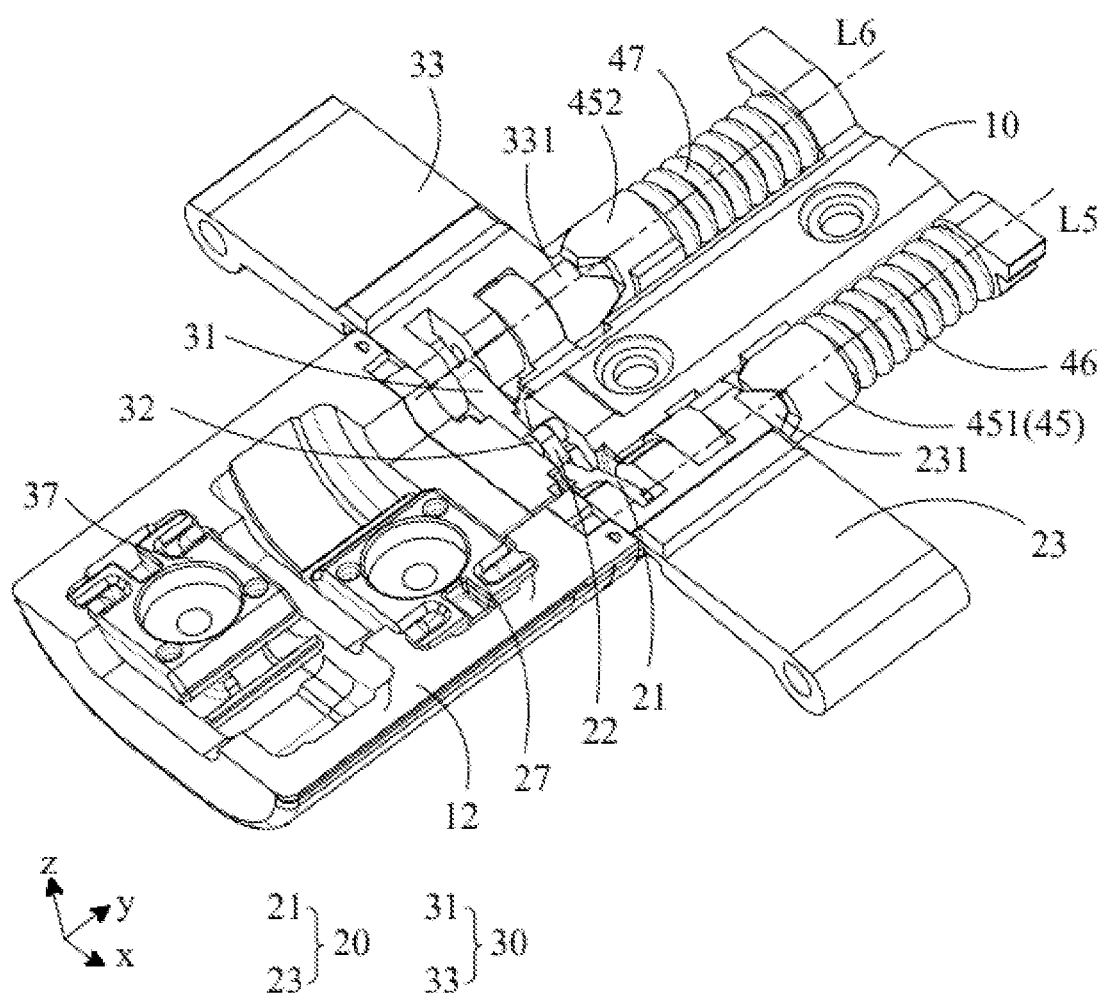
FIG. 4 is a schematic structural diagram of a hinge according to an embodiment of the present disclosure.

As shown in FIG. 4, FIG. 4 is a schematic structural diagram of a hinge according to an embodiment of the present disclosure. Each of the first hinge 2a and the second hinge 2b includes a first rotating mechanism 20 and a second rotating mechanism 30, the first rotating mechanism 20 and the second rotating mechanism 30 are rotatably connected to a fixing bracket 10, respectively, and the first rotating mechanism 20 and the second rotating mechanism 30 are disposed oppositely.

In an embodiment of present disclosure, the first rotating mechanism 20 and the second rotating mechanism 30 have a same structure. In an actual application, the structures of the first rotating mechanism 20 and the second rotating mechanism 30 may be same or different, which is not limited herein.

The rotational axis includes a fifth axis L5 and a sixth axis L6 that are parallel to each other and spaced apart. Specifically, the fifth axis L5 and the sixth axis L6 are both parallel to the second direction y, and spaced apart in the first direction x, the first rotating mechanism 20 is rotatable about the fifth axis L5, and the second rotating mechanism 30 is rotatable about the sixth axis L6.

The first rotating mechanism 20 includes a first transmission member 21, the second rotating mechanism 30 includes a second transmission member 31, the first transmission member 21 is movably connected to the fixing bracket 10, and the second transmission member 31 is movably connected to the fixing bracket 10.

Figure 5:
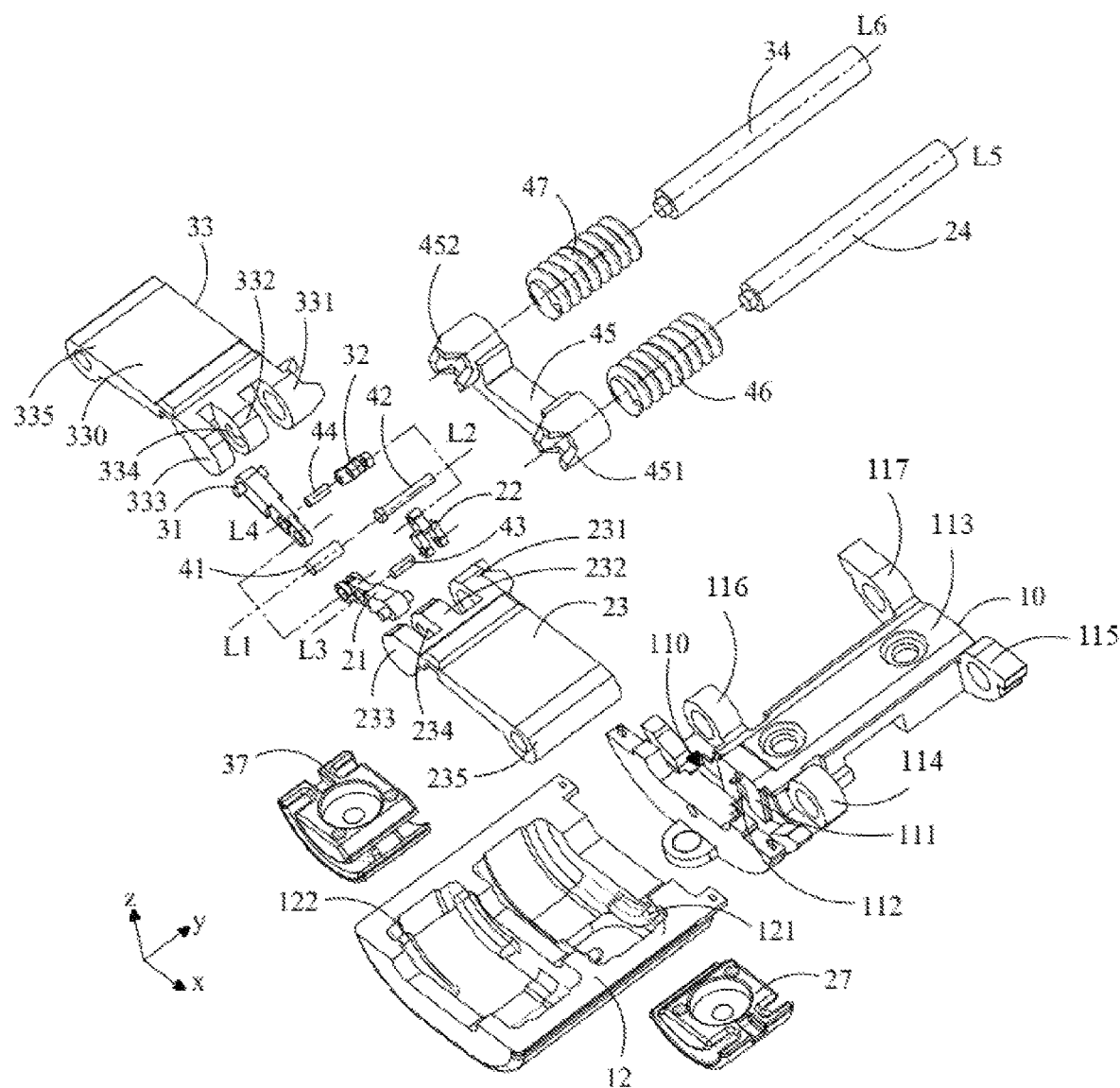
FIG. 5 is a schematic exploded view of a hinge according to an embodiment of the present disclosure.

As shown in FIG. 5, FIG. 5 is a schematic exploded view of a hinge according to an embodiment of the present disclosure. The first transmission member 21 is movably connected to the fixing bracket 10 along a first axis L1, the second transmission member 31 is movably connected to the fixing bracket 10 along the first axis L1, and the first axis L1 is parallel to the second direction y.

During an unfolding or folding process of the hinge, the first transmission member 21 and the second transmission member 31 are rotatable in opposite directions about the first axis L1, respectively, while the first and second transmission members 21 and 31 may also slide in a same direction which is same as or opposite to the third direction z.

As shown in FIGS. 4 and 5, each of the first hinge 2a and the second hinge 2b further includes a first rotating member 41, the first rotating member 41 is movably connected to the fixing bracket 10 along the first axis L1.

Figure 6:
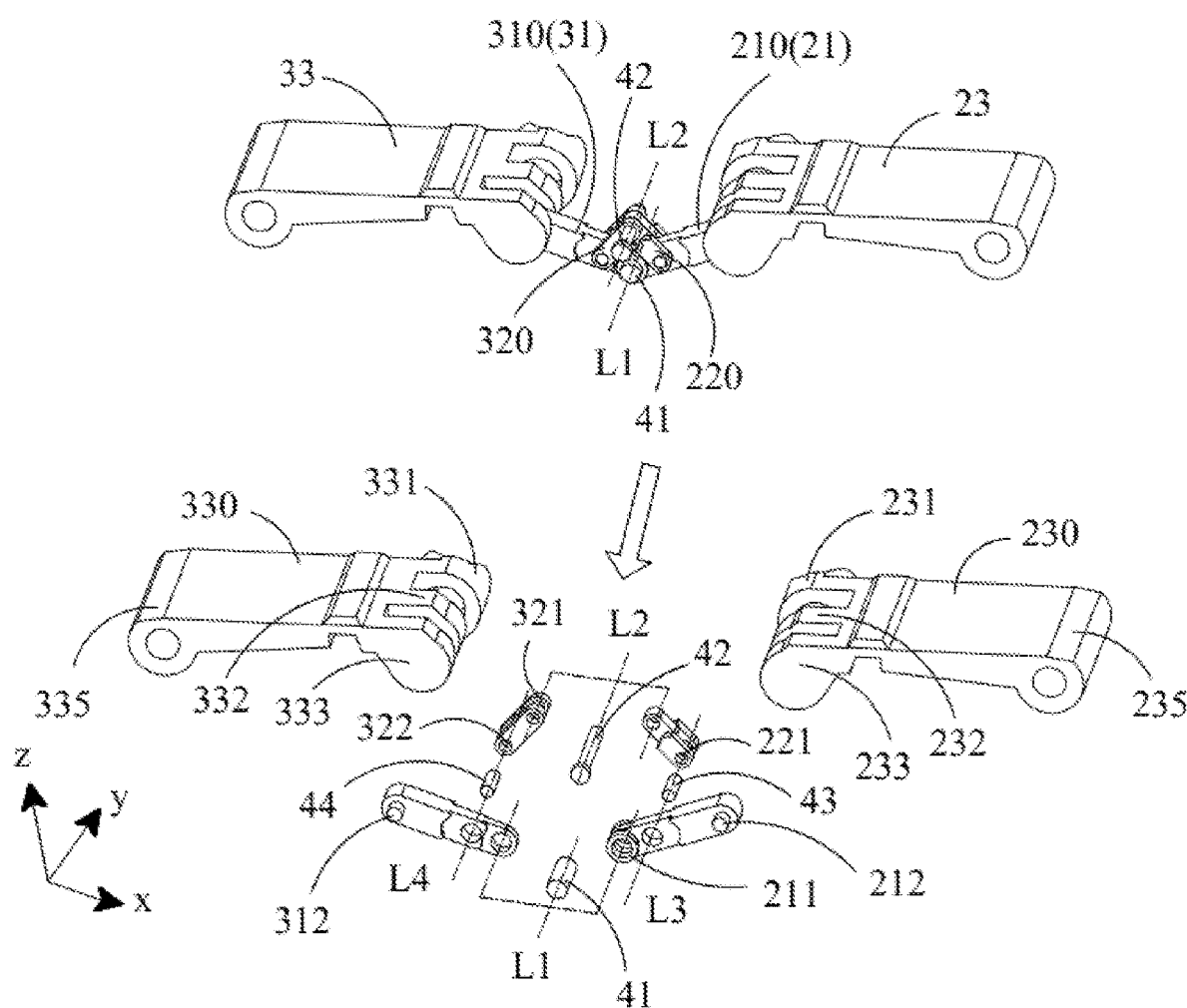
FIG. 6 is a schematic structural view of a first rotating mechanism and a second rotating mechanism according to an embodiment of the present disclosure.

As shown in FIG. 6, FIG. 6 is a schematic exploded view of a first rotating mechanism and a second rotating mechanism according to an embodiment of the present disclosure. The first transmission member 21 includes a first connecting link 210, and the second transmission member 31 includes a second connecting link 310. One end of the first connecting link 210 and one end of the second connecting link 310 are both rotatably connected to the first rotating member 41 along the first axis L1.

As shown in FIG. 6, the one end of the first connecting link 210 has two first extension plates 211 extending from a base portion of the first connecting link 210 in a first direction x, the two first extension plates 211 are parallel to each other and spaced apart in a second direction y.

Each of the two first extension plates 211 is provided with a shaft hole, and the one end of the second connecting link 310 is also provided with a shaft hole, and is rotatably connected between the two first extension plates 211. The first rotating member 41 passes through the shaft holes of the two first extension plates 211 and the shaft hole at the one end of the second connecting link 310 along the first axis L1, so that movement of the first connecting link 210 and the second connecting link 310 is at a same plane. In practical application, the first extension plates 211 may also be provided on the second connecting link 310, and one end of the first connecting link 210 is rotatably connected between the two first extension plates 211 of the second connecting link 310.

As shown in FIG. 5, one end of the fixing bracket 110 is provided with a groove 110, and the groove 110 penetrates through the fixing bracket 10. The groove 110 has two opposed inner walls 111, each of the two opposed inner walls 111 is provided with a first sliding groove 112, the first sliding groove 112 extends in the third direction z. It should be noted that, due to shielding of an end of the fixing bracket 10, the inner wall 111 on one side and the first sliding groove 112 on the inner wall 111 may be only shown in FIG. 5, and a structure of the inner wall on another opposite side is same as a structure of the inner wall 111 shown in the figure.

In the embodiment of the present application, the first rotating member 41 is a pin shaft, an axis of the first rotating member 41 coincides with the first axis L1, and the first rotating member 41 is rotatable about the first axis L1. At a same time, driven by the first connecting link 210 and the second connecting link 310, the first rotating member 41 may also slide in the first sliding grooves 112 of the fixing bracket 10 in a same or an opposite direction to the third direction z.

As shown in FIG. 4, both the first hinge 2a and the second hinge 2b further include a third transmission member 22 and a fourth transmission member 32, one end of the third transmission member 22 is rotatably connected to the fixing bracket 10, another end of the third transmission member 22 is rotatably connected to the first transmission member 21, one end of the fourth transmission member 32 is rotatably connected to the fixing bracket 10, and another end of the fourth transmission member 32 is rotatably connected to the second transmission member 31.

As shown in FIG. 5, the one end of the third transmission member 22 is rotatably connected to the fixing bracket 10 along the second axis L2, and the another end of the third transmission member 22 is rotatably connected to the first transmission member 21 along the third axis L3; the one end of the fourth transmission member 32 is rotatably connected to the fixing bracket 10 along the second axis L2, and the another end of the fourth transmission member 32 is rotatably connected to the second transmission member 31 along the fourth axis L4.

The second axis L2, the third axis L3, and the fourth axis L4 are all parallel to the second direction y and spaced apart in the first direction x.

As shown in FIG. 5, the first hinge 2a and the second hinge 2b both further include a second rotating member 42, the second rotating member 42 is a pin shaft. The second rotating member 42 is rotatably connected to the fixing bracket 10 along a second axis L2.

As shown in FIG. 6, the third transmission member 22 includes a third connecting link 220, and the fourth transmission member 32 includes a fourth connecting link 320. Both one end of the third connecting link 220 and one end of the fourth connecting link 320 are rotatably connected to the second rotating member 42 along the second axis L2.

Specifically, the one end of the fourth connecting link 320 includes two second extension plates 321 extending from a base portion of the fourth connecting link 320, the two second extension plates 321 are parallel to each other and spaced apart in a second direction y. Each of the two second extension plates 321 is provided with a shaft hole, the one end of the third connecting link 220 is also provided with a shaft hole, and the one end of the third connecting link 220 is inserted between the two second extension plates 321. The second rotating member 42 passes through the two second extension plates 321 and the one end of the third connecting link 220, so that the third connecting link 220 and the fourth connecting link 320 always move on a same plane.

In practical application, the second extension plates 321 may also be provided at the one end of the third connecting link 220, and the one end of the fourth connecting link 320 is rotatably connected between the two second extension plates 321.

Further, as shown in FIG. 5, the first hinge 2a and the second hinge 2b both further include a third rotating member 43 and a fourth rotating member 44.

As shown in FIG. 6, an axis of the third rotating member 43 coincides with the third axis L3, and can be rotatably connected to the first connecting link 210 along the third axis L3, and the another end of the third connecting link 220 is fixedly connected to the third rotating member 43. An axis of the fourth rotating member 44 coincides with the fourth axis L4, the fourth rotating member 44 passes through the shaft hole of the second connecting link 310, and is rotatably connected to the second connecting link 310 along the fourth axis L4, and the another end of the fourth connecting link 320 is fixedly connected to the fourth rotating member 44.

The another end of the third connecting link 220 has two third extension plates 221 extending from the base portion of the third connecting link 220, the two third extension plates 221 are parallel to each other and spaced apart in the second direction y. Each of the two third extension plates 221 is provided with a shaft hole, and a base portion of the first connecting link 210 extends between the two third extension plates 221. The third rotating member 43 passes through the shaft holes of the two third extension plates 221 and the base portion of the first connecting link 210 and is fixedly connected to the another end of the third connecting link 220.

The another end of the fourth connecting link 320 has two fourth extension plates 322 extending from the base portion of the fourth connecting link 320, the two fourth extension plates 322 are parallel to each other and spaced apart in the second direction y. Each of the two fourth extension plates 322 is provided with a shaft hole, and a base portion of the second connecting link 310 extends between the two fourth extension plates 322. The fourth rotating member 44 passes through the shaft holes of the two fourth extension plates 322 and the base portion of the second connecting link 310 and is fixedly connected to the another end of the fourth connecting link 320.

The third rotating member 43 and the fourth rotating member 44 are both pin shafts. The third rotating member 43 may be fixedly connected to the third connecting link 220 by a key connection, an interference fit, or the like. The fourth rotating member 44 may be fixedly connected to the fourth connecting link 320 by a key connection, an interference fit, or the like.

Further, as shown in FIG. 4, the first rotating mechanism 20 further includes a first holding arm 23, the second rotating mechanism 30 further includes a second holding arm 33, the first holding arm 23 is rotatably connected to the fixing bracket 10 along the fifth axis L5, and the second holding arm 33 is rotatably connected to the fixing bracket 10 along the sixth axis L6.

As shown in FIG. 5, the first rotating mechanism 20 further includes a fifth rotating member 24, and the second rotating mechanism 30 further includes a sixth rotating member 34. The fifth rotating member 24 and the sixth rotating member 34 are both rotating shafts. An axis of the fifth rotating member 24 coincides with the fifth axis L5, and an axis of the sixth rotating member 34 coincides with the sixth axis L6.

The fixing bracket 10 further includes a main body portion 113, a seventh connection portion 114 and a ninth connection portion 115 extending from the main body portion 113 in the first direction x and spaced apart in the second direction y, and an eighth connection portion 116 and a tenth connection portion 117 extending in a direction opposite to the first direction x and spaced apart in the second direction y, and each of the seventh connection portion 114, the ninth connection portion 115, the eighth connection portion 116, and the tenth connection portion 117 is provided with a shaft hole.

As shown in FIGS. 4 and 5, the fifth rotating member 24 passes through the seventh connection portion 114 and the ninth connection portion 115 and can rotate with respect to the seventh connection portion 114 and the ninth connection portion 115, and the sixth rotating member 34 passes through the eighth connection portion 116 and the tenth connection portion 117 and can rotate with respect to the eighth connection portion 116 and the tenth connection portion 117.

The first holding arm 23 includes a first base portion 230 and a fifth connection portion 231, a first connection portion 232, and a second connection portion 233 which extend from the first base portion 230 in a direction opposite to the first direction x and are spaced apart from each other. The seventh connection portion 114 extends between the fifth connection portion 231 and the first connection portion 232, and the fifth connection portion 231 and the first connection portion 232 may be sleeved on the fifth rotating member 24, the first holding arm 23 may rotate around the fifth rotating member 24.

The second holding arm 33 includes a second base portion 330 and a sixth connection portion 331, a third connection portion 332, and a fourth connection portion 333 extending from the second base portion 330 in the first direction x. The eighth connection portion 116 extends between the sixth connection portion 331 and the third connection portion 332. The sixth connection portion 331 and the third connection portion 332 may be sleeved on the sixth rotating member 34, the second holding arm 33 may rotate around the sixth rotating member 34.

Figure 7:
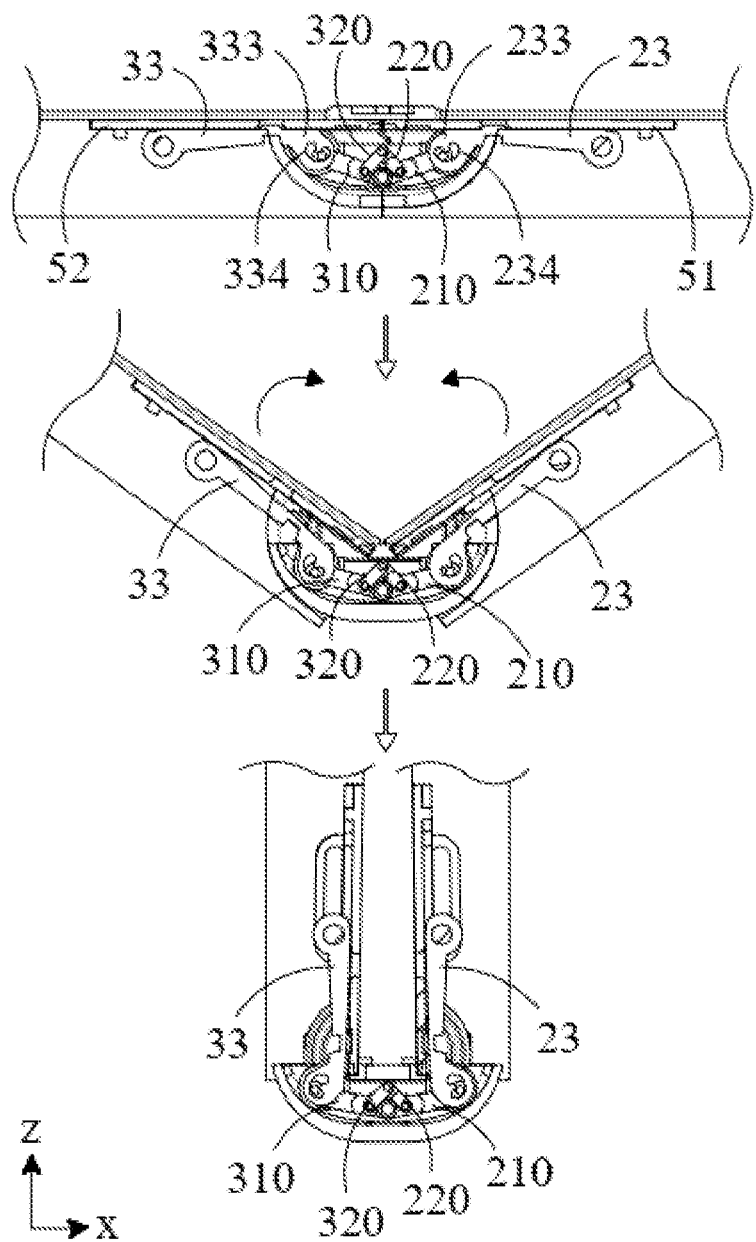
FIG. 7 is a schematic diagram of a folding process of an electronic device according to an embodiment of the present disclosure.

Referring to FIGS. 6 and 7, FIG. 7 is a schematic diagram of a folding process of an electronic device according to an embodiment of the present disclosure. The another end of the first connecting link 210 is movably connected to the first holding arm 23, and the another end of the second connecting link 310 is movably connected to the second holding arm 33. During the unfolding or folding process of the electronic device, the first holding arm 23 is rotated about a fifth axis L5, and may drive the first connecting link 210 to rotate about the first axis L1. The second holding arm 33 rotates about the sixth axis L6 and may drive the second connecting link 310 to rotate about the first axis L1.

The first holding arm 23 is provided with second sliding grooves 234. As shown in FIG. 5, a side wall of a side of the first connection portion 232 facing the second connection portion 233 and a side wall of a side of the second connection portion 233 facing the first connection portion 232 are both provided with the second sliding groove 234, and the two second sliding grooves 234 are provided opposite to each other.

As shown in FIG. 6, the another end of the first connecting link 210 is provided with first positioning columns 212, the first positioning columns 212 extend from the base portion of the first connecting link 210 in the second direction y and a direction opposite to the second direction y. The first positioning columns 212 are movably mounted in the second sliding grooves 234 of the first holding arm 23, and may slide and rotate in the second slide grooves 234.

The second holding arm 33 is provided with third sliding grooves 334. As shown in FIG. 4, a side wall of a side of the third connection portion 332 facing the fourth connection portion 333 and the side wall of a side of the fourth connection portion 333 facing the third connection portion 331 are both provided with the third sliding groove 334, and the two third sliding grooves 334 are provided opposite to each other.

As shown in FIG. 6, the another end of the second connecting link 310 is provided with second positioning columns 312, the second positioning columns 312 extends from the base portion of the second connecting link 310 in a second direction y and the direction opposite to the second direction y, the second positioning columns 312 are movably mounted in the third sliding grooves 334 of the second holding arm 33, and may slide and rotate in the third sliding groove 334.

In a practical application, a shaft hole may be provided at each of one ends of the first connecting link 210 and the second connecting link 310 away from the first rotating member 41, and the fixing member may be fixedly connected to the first connecting link by passing through the shaft hole at the another end of the first connecting link 210, and an opposite end of the fixing member may be movably mounted in the second sliding grooves 234. At a same time, the fixing member may be fixedly connected to the second connecting link 310 by passing through the shaft hole at the another end of the second connecting link 310, and the opposite end of the fixing member may be movably mounted in the third sliding grooves 334, and the above fixing member may be a pin shaft. Thus, same technical effects as those of the above-described embodiment can be realized, and details are not described herein.

As shown in FIG. 4, each of the first and second hinges further includes a first holding member 45, a first elastic member 46, and a second elastic member 47.

Specifically, in conjunction with that shown in FIGS. 4 and 5, the first holder 45 has a first cam 451 extending from a base portion of the first holder 45 in to the first direction x and a second cam 452 extending in a direction opposite to the x direction. The base portion of the first holder 45 is engaged with the bottom of the main body portion 113 of the fixing bracket 10. The first cam 451 and the second cam 452 extend from opposite sides of the main body portion 113, respectively. The fifth rotating member 24 passes through the first cam 451 and the sixth rotating member 34 passes through the second cam 452.

The fifth connecting portion 231 of the first holding arm 23 may be configured as a cam, and the sixth connecting portion 331 of the second holding arm 33 may be configured as a cam. The fifth connecting portion 231 is engaged with the first cam 451, and the sixth connecting portion 331 is engaged with the second cam 452.

The first elastic member 46 is sleeved on the fifth rotating member 24 and is sandwiched between the ninth connection portion 115 and the first cam 451. The second elastic member 47 is sleeved on the sixth rotating member 34 and sandwiched between the tenth connection portion 117 and the second cam 452. In the present embodiment, both the first elastic member 46 and the second elastic member 47 are both springs.

Each of the first cam 451, the second cam 452, the fifth connection portion 231, and the sixth connection portion 331 has a plurality of protrusions and grooves defined between adjacent protrusions, each protrusion has a flat end, the flat end has a sliding surface, and the sliding surface is a connecting surface between two inclined sides of each protrusion.

When the electronic device 1000 is in the flat or fully folded state, the flexible portion 101 is in a corresponding flat or folded state, the first cam 451 is normally engaged with the fifth connecting portion 231, a protrusion of the first cam 451 is received in the groove of the fifth connection portion 231, the second cam 452 is normally engaged with the sixth connection portion 331, and a protrusion of the second cam 452 is received in the groove of the sixth connection portion 331.

When the electronic device 1000 is in the transition folded state, the flexible portion 101 is in the bent state, the first cam 451 is in open engagement with the fifth connection portion 231, a sliding surface of the protrusion of the first cam 451 is in contact with the sliding surface of the protrusion of the fifth connection portion 231; the second cam 452 is in open engagement with the sixth connection portion 331, and a sliding surface of the protrusion of the second cam 452 is in contact with the sliding surface of the protrusion of the sixth connection portion 331.

As shown in FIG. 4, during a process of folding the electronic device 1000 from the flat state to the transition folded state, the first holding arm 23 may rotate about the fifth axis L5, the second holding arm 33 may rotate about the sixth axis L6, each of the mutually engaged cams gradually changes from the general (or normal) engagement to the open engagement, the protrusions of the first cam 451 are gradually disengaged from the grooves of the fifth connection portion 231, the protrusions of the second cam 452 are gradually disengaged from the grooves of the sixth connection portion 331, and the stroke of the first holding member 45 is compressed, so that both the first elastic member 46 and the second elastic member 47 are compressed by the first holding member 45, resulting in a gradual increase in an amount of elastic deformation of the first elastic member 46 and the second elastic member 47. When an angle between the first portion 102 and the second portion 103 of the flexible display panel body is 0 to 30 degrees, the electronic device 1000 can be restored to a flat state without external force under the action of pressing force of each elastic member and a pressure angle of the cam.

When the electronic device 1000 is in the transition folded state, each cam engaged with each other changes to open engagement, the pressure angle of each cam is zero, the angle between the first portion 102 and the second portion 103 of the flexible display panel body can be maintained at 30 to 150 degrees, the elastic deformation amount of the first elastic member 46 and the second elastic member 47 remains constant, and the electronic device 1000 can be maintained in the transition folded state without external force.

When the electronic device 1000 is folded from the transition folded state to the fully folded state, each of the mutually engaged cams is gradually changed from the open engagement to the general engagement, the protrusion of the first cam 451 is gradually accommodated in the groove of the fifth connection portion 231, and the protrusion of the second cam 452 is gradually accommodated in the groove of the sixth connection portion 331. The elastic deformation amount of the first elastic member 46 and the second elastic member 47 is gradually reduced, when the angle between the first portion 102 and the second portion 103 of the flexible display panel body is 150 to 180 degrees, the electronic device 1000 can be automatically folded from the transition folded state to the fully folded state without an external force, under the action of the pressing force of each elastic member and the pressure angle of the cam.

Figure 8:
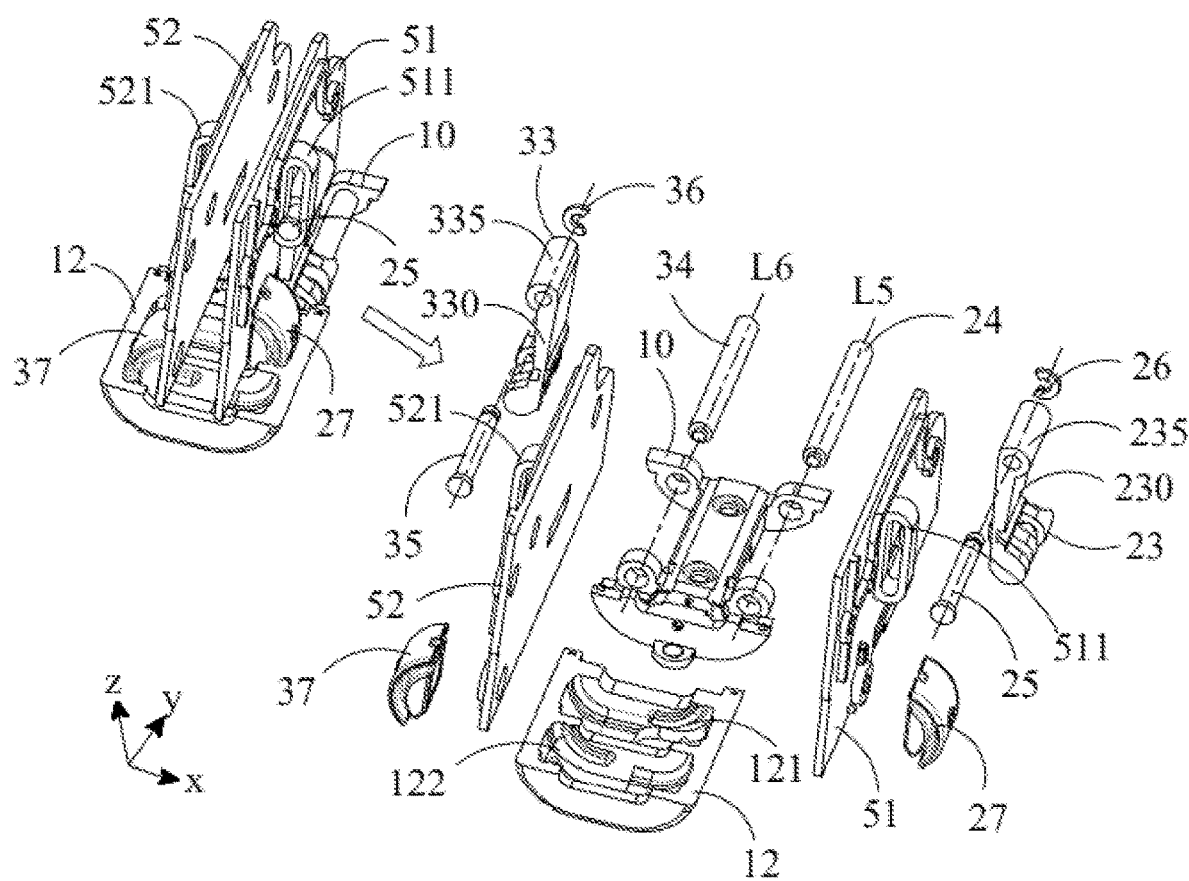
FIG. 8 is a schematic structural diagram of a first support plate and a second support plate according to an embodiment of the present disclosure.

As shown in FIG. 8, FIG. 8 is a schematic structural view of a first support plate and a second support plate according to an embodiment of the present application, the first hinge 2a and the second hinge 2b both further include a first support plate 51 and a second support plate 52, the first support plate 51 is connected to a first holding arm 23 to move under driving of the first holding arm 23. The second support plate 52 is connected to the second holding arm 33 to move under driving of the second holding arm 33.

The first support plate 51 is fixedly connected to the front side of the first housing 200 by screws, and the first support plate 51 may be used to support the first portion 102 and the flexible portion 101. The second support plate 52 is fixedly connected to the front side of the second housing 300 by screws, and the second support plate 52 may be used to support the second portion 103 and the flexible portion 101.

The first support plate 51 is provided with a fourth sliding groove 511, and the second support plate 52 is provided with a fifth sliding groove 521. Each of the fourth sliding groove 511 and the fifth sliding groove 521 may be any one of a linear groove or an arcuate groove.

The first holding arm 23 has a first fixing portion 235 extending from the first base portion 230, and the second holding arm 33 has a second fixing portion 335 extending from the second base portion 330. Each of the first fixing portion 235 and the second fixing portion 335 has a shaft hole.

As shown in FIG. 8, the first rotating mechanism 20 further includes a first fixing member 25 and a first clip 26, and the second rotating mechanism 30 further includes a second fixing member 35 and a second clip 36, both the first fixing member 2 and the second fixing member 35 are pin shafts.

The first fixing member 25 passes through the fourth sliding groove 511, the shaft hole of the first fixing portion 235, and the first clip 26 sequentially, and is fixedly connected to the first fixing portion 235, and the first fixing member 25 may slide and rotate in the fourth sliding groove 511. The second fixing member 35 passes through the fifth sliding groove 521, the shaft hole of the second fixing portion 335, and the second clip 36 sequentially, and is fixedly connected to the second fixing portion 335, and the second fixing member 35 may slide and rotate in the fifth sliding groove 521.

Each of the first and second hinges further comprises a base 12, the base 12 is provided with a sixth sliding groove 121 and a seventh sliding groove 122 spaced side by side. The first rotating mechanism 20 further comprises a first slide 27, and the second rotating mechanism 30 further comprises a second slide 37, the first slider 27 may be slidably mounted into the sixth sliding groove 121, and the second slider 37 may be slidably mounted into the seventh sliding groove 122.

In the embodiment of the present application, the first slider 27 and the first support plate 51 may be fixedly connected by screw connection or engagement, and the second slider 37 and the second support plate 52 may be fixedly connected by screw connection or engagement. In practical applications, the first slider 27 and the first support plate 51 may be integrally formed, and the second slider 37 and the second support plate 52 may be integrally formed.

As shown in FIG. 3, the hinge further includes a third support plate 53 and a fourth support plate 54, the third support plate 53 is fixedly connected to the front side of the first housing 200 by screws, the third support plate 53 is in a same plane as the first support plate 51 for supporting the first portion 102 and the flexible portion 101. The fourth support plate 54 is fixedly connected to the second housing 300 by screws, and the fourth support plate 54 is in a same plane as the second support plate 52 for supporting the second portion 103 and the flexible portion 101.

The advantageous effects of the embodiments of the present disclosure are: embodiments of the present application provide a hinge, a flexible display panel, and an electronic device. The electronic device includes a flexible display panel, the flexible display panel includes a flexible display panel body and a hinge, the hinge includes a first rotating mechanism and a second rotating mechanism, the first rotating mechanism includes a first transmission member, the second rotating mechanism includes a second transmission member, the hinge further includes a third transmission member and a fourth transmission member, each of the first transmission member and the second transmission member is movably connected to a fixed bracket along a first axis so that the first transmission member can move while driving the second transmission member to move, the third transmission member is rotatably connected to the fixing bracket along a second axis, the third transmission member is rotatably connected to the first transmission member along a third axis, the fourth transmission member is rotatably connected to the fixing bracket along the second axis, and the fourth transmission member is rotatably connected to the second transmission member along a fourth axis, so that rotating angles of the first transmission member and the second transmission member are always same, thereby enabling an effect of bilateral synchronous rotation of the first rotating mechanism and second rotating mechanism of the hinge.

In summary, although the present disclosure discloses the foregoing preferred embodiment, the foregoing preferred embodiment is not intended to limit the present disclosure. A person of ordinary skill in the art may make various changes and finishes without departing from the spirit and scope of the present disclosure. Therefore, the protection scope of the present application is based on the scope defined by the claims.

What is claimed is:

1. A hinge, comprising:
    a fixing bracket;
    a first rotating mechanism comprising a first transmission member, the first transmission member movably connected to the fixing bracket along a first axis;
    a second rotating mechanism comprising a second transmission member, the second transmission member movably connected to the fixing bracket along the first axis;
    a third transmission member rotatably connected to the fixing bracket along a second axis, wherein the third transmission member is rotatably connected to the first transmission member along a third axis; and
    a fourth transmission member rotatably connected to the fixing bracket along the second axis, wherein the fourth transmission member is rotatably connected to the second transmission member along a fourth axis.

2. The hinge according to claim 1, wherein the hinge further comprises a first rotating member, the first transmission member comprises a first connecting link, and the second transmission member comprises a second connecting link; and
    wherein the first rotating member is movably connected to the fixing bracket along the first axis, and one end of the first connecting link and one end of the second connecting link are both rotatably connected to the first rotating member along the first axis.

3. The hinge according to claim 2, wherein the one end of the first connecting link has two first extension plates opposite to and spaced apart from each other and extending from a base portion of the first connecting link; and
    wherein the first rotating member passes through the two first extension plates, and the one end of the second connecting link is rotatably connected between the two first extension plates.

4. The hinge according to claim 2, wherein the fixing bracket has two inner walls disposed oppositely, each of the two inner walls is provided with a first slide groove, and opposite ends of the first rotating member are movably mounted in the first slide grooves.

5. The hinge according to claim 2, wherein the hinge further comprises a second rotating member, the third transmission member comprises a third connecting link, and the fourth transmission member comprises a fourth connecting link;
    the second rotating member is rotatably connected to the fixing bracket along the second axis, and one end of the third connecting link and one end of the fourth connecting link are both rotatably connected to the second rotating member along the second axis.

6. The hinge according to claim 5, wherein the hinge further comprises a third rotating member and a fourth rotating member;

wherein the third rotating member is rotatably connected to the first connecting link along the third axis, and another end of the third connecting link is fixedly connected to the third rotating member; the fourth rotating member is rotatably connected to the second connecting link along the fourth axis, and another end of the fourth connecting link is fixedly connected to the fourth rotating member.

7. The hinge according to claim 2, wherein the first rotating mechanism comprises a first holding arm, the second rotating mechanism comprises a second holding arm, the first holding arm is rotatably connected to the fixing bracket along a fifth axis, and the second holding arm is rotatably connected to the fixing bracket along a sixth axis;

wherein another end of the first connecting link is movably connected to the first holding arm, and another end of the second connecting link is movably connected to the second holding arm.

8. The hinge according to claim 7, wherein the first holding arm is provided with second sliding grooves, and the second holding arm is provided with third sliding grooves; and wherein the another end of the first connecting link is provided with first positioning columns, the first positioning columns are movably mounted in the second sliding grooves, and the another end of the second connecting link is provided with second positioning columns, and the second positioning columns are movably mounted in the third sliding grooves.

9. The hinge according to claim 8, wherein the first holding arm comprises a first base portion, and a first connection portion and a second connection portion, the first connection portion and the second connection portion extend from one side of the first base portion and are spaced apart, and a side of the first connection portion facing the second connection portion and a side of the second connection portion facing the first connection portion are both provided with the second sliding groove; and the second holding arm includes a second base portion, and a third connection portion and a fourth connection portion, the third connection portion and the fourth connection portion extend from one side of the second base portion and are spaced apart, and a side of the third connection portion facing the fourth connection portion and a side of the fourth connection portion facing the third connection portion are both provided with the third sliding groove.

10. The hinge according to claim 9, wherein the first holding arm comprises a fifth connection portion extending from the one side of the first base portion and spaced apart from the first connection portion, and the second holding arm includes a sixth connection portion extending from the one side of the second base portion and spaced apart from the third connection portion; and the fixing bracket comprises a main body portion, a seventh connection portion extending from one side of the main body portion, and an eighth connection portion extending from another side of the main body portion; the first rotating mechanism includes a fifth rotating member, and the second rotating mechanism includes a sixth rotating member;

wherein the seventh connection portion extends between the first connection portion and the fifth connection portion, and the fifth rotating member passes through the first connection portion and the seventh connection portion along the fifth axis;

the eighth connection portion extends between the third connection portion and the sixth connection portion, and the sixth rotating member sequentially passes through the third connection portion and the eighth connection portion along the sixth axis.

11. A flexible display panel, comprising:

a flexible display panel body comprising a flexible portion, and a first portion and a second portion connected to opposite ends of the flexible portion; and a hinge comprising:

a fixing bracket;

a first rotating mechanism comprising a first transmission member, the first transmission member movably connected to the fixing bracket along a first axis;

a second rotating mechanism comprising a second transmission member, the second transmission member movably connected to the fixing bracket along the first axis;

a third transmission member rotatably connected to the fixing bracket along a second axis, wherein the third transmission member is rotatably connected to the first transmission member along a third axis; and a fourth transmission member rotatably connected to the fixing bracket along the second axis, wherein the fourth transmission member is rotatably connected to the second transmission member along a fourth axis, wherein the first portion is fixedly connected to the first rotating mechanism, and the second portion is fixedly connected to the second rotating mechanism.

12. The flexible display panel according to claim 11, wherein the hinge further comprises a first rotating member, the first transmission member comprises a first connecting link, and the second transmission member comprises a second connecting link; and wherein the first rotating member is movably connected to the fixing bracket along the first axis, and one end of the first connecting link and one end of the second connecting link are both rotatably connected to the first rotating member along the first axis.

13. The flexible display panel according to claim 12, wherein the one end of the first connecting link has two first extension plates opposite to and spaced apart from each other and extending from a base portion of the first connecting link; and wherein the first rotating member passes through the two first extension plates, and the one end of the second connecting link is rotatably connected between the two first extension plates.

14. The flexible display panel according to claim 12, wherein the fixing bracket has two inner walls disposed oppositely, each of the two inner walls is provided with a first slide groove, and opposite ends of the first rotating member are movably mounted in the first slide grooves.

15. The flexible display panel according to claim 12, wherein the hinge further comprises a second rotating member, the third transmission member comprises a third connecting link, and the fourth transmission member comprises a fourth connecting link;

the second rotating member is rotatably connected to the fixing bracket along the second axis, and one end of the third connecting link and one end of the fourth connecting link are both rotatably connected to the second rotating member along the second axis.

16. The flexible display panel according to claim 15, wherein the hinge further comprises a third rotating member and a fourth rotating member;
   wherein the third rotating member is rotatably connected to the first connecting link along the third axis, and another end of the third connecting link is fixedly connected to the third rotating member; the fourth rotating member is rotatably connected to the second connecting link along the fourth axis, and another end of the fourth connecting link is fixedly connected to the fourth rotating member.

17. The flexible display panel according to claim 12, wherein the first rotating mechanism comprises a first holding arm, the second rotating mechanism comprises a second holding arm, the first holding arm is rotatably connected to the fixing bracket along a fifth axis, and the second holding arm is rotatably connected to the fixing bracket along a sixth axis;
   wherein another end of the first connecting link is movably connected to the first holding arm and another end of the second connecting link is movably connected to the second holding arm.

18. The flexible display panel according to claim 17, wherein the first holding arm is provided with second sliding grooves, and the second holding arm is provided with third sliding grooves; and
   wherein the another end of the first connecting link is provided with first positioning columns, the first positioning columns are movably mounted in the second sliding grooves, and the another end of the second connecting link is provided with second positioning columns, and the second positioning columns are movably mounted in the third sliding grooves.

19. The hinge according to claim 18, wherein the first holding arm comprises a first base portion, and a first connection portion and a second connection portion, the first connection portion and the second connection portion extend from one side of the first base portion and are spaced apart, and a side of the first connection portion facing the second connection portion and a side of the second connection portion facing the first connection portion are both provided with the second sliding groove; and
   the second holding arm includes a second base portion, and a third connection portion and a fourth connection portion, the third connection portion and the fourth connection portion extend from one side of the second base portion and are spaced apart, and a side of the third connection portion facing the fourth connection portion and a side of the fourth connection portion facing the third connection portion are both provided with the third sliding groove.

20. An electronic device, comprising a flexible display panel, and the flexible display panel comprising:
   a flexible display panel body comprising a flexible portion, and a first portion and a second portion connected to opposite ends of the flexible portion; and
   a hinge comprising:
   a fixing bracket;
   a first rotating mechanism comprising a first transmission member, the first transmission member movably connected to the fixing bracket along a first axis;
   a second rotating mechanism comprising a second transmission member, the second transmission member movably connected to the fixing bracket along the first axis;
   a third transmission member rotatably connected to the fixing bracket along a second axis, and rotatably connected to the first transmission member along a third axis; and
   a fourth transmission member rotatably connected to the fixing bracket along the second axis, and rotatably connected to the second transmission member along a fourth axis,
   wherein the first portion is fixedly connected to the first rotating mechanism, and the second portion is fixedly connected to the second rotating mechanism.

* * * * *